(12) United States Patent
Tang et al.

(10) Patent No.: US 9,899,272 B2
(45) Date of Patent: Feb. 20, 2018

(54) METHODS OF FABRICATING SEMICONDUCTOR DEVICES INCLUDING COMPLEMENTARY METAL OXIDE SEMICONDUCTOR TRANSISTORS

(71) Applicant: Samsung Electronics Co., Ltd., Suwon-si, Gyeonggi-do (KR)

(72) Inventors: Poren Tang, Hwaseong-si (KR); Sunjung Steve Kim, Suwon-si (KR); Moon Seung Yang, Hwaseong-si (KR); Seung Hun Lee, Suwon-si (KR); Hyun Jung Lee, Suwon-si (KR); Geun Hee Jeong, Hwaseong-si (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 15/234,170

(22) Filed: Aug. 11, 2016

(65) Prior Publication Data
US 2017/0092547 A1    Mar. 30, 2017

(30) Foreign Application Priority Data
Sep. 24, 2015  (KR) .................. 10-2015-0135860

(51) Int. Cl.
*H01L 21/8238* (2006.01)
*H01L 21/02* (2006.01)
(Continued)

(52) U.S. Cl.
CPC .. *H01L 21/823892* (2013.01); *H01L 21/0254* (2013.01); *H01L 21/02499* (2013.01); *H01L 21/02532* (2013.01); *H01L 21/02546* (2013.01); *H01L 21/308* (2013.01); *H01L 21/30604* (2013.01); *H01L 21/30612* (2013.01); *H01L 21/823807* (2013.01); *H01L 27/092* (2013.01); *H01L 29/0653* (2013.01); *H01L 29/1083* (2013.01); *H01L 29/16* (2013.01); *H01L 29/161* (2013.01); *H01L 29/20* (2013.01); *H01L 29/2003* (2013.01); *H01L 21/8258* (2013.01)

(58) Field of Classification Search
CPC ........... H01L 21/823892; H01L 27/092; H01L 29/16; H01L 21/30604; H01L 21/0254; H01L 29/0653; H01L 21/02546; H01L 21/02532; H01L 21/823807; H01L 21/308; H01L 21/30612; H01L 21/02499; H01L 29/20
See application file for complete search history.

(56) References Cited

U.S. PATENT DOCUMENTS 6,724,008 B2   4/2004  Fitzergald
6,991,972 B2   1/2006  Lochtefeld et al.
(Continued)

FOREIGN PATENT DOCUMENTS

JP    3512701 B2    1/2004
JP    4690326 B2    2/2011
(Continued)

*Primary Examiner* — Selim Ahmed
(74) *Attorney, Agent, or Firm* — Ward and Smith, P.A.

(57) ABSTRACT

Methods of fabricating semiconductor device are provided including forming first and second material layers for a first transistor using epitaxial growth processes. A recess region is formed by partially etching the first and second material layers. Third and fourth material layers for a second transistor are formed using epitaxial growth processes.

20 Claims, 10 Drawing Sheets

(51) Int. Cl.
*H01L 21/306* (2006.01)
*H01L 21/308* (2006.01)
*H01L 29/16* (2006.01)
*H01L 29/161* (2006.01)
*H01L 29/20* (2006.01)
*H01L 29/10* (2006.01)
*H01L 29/06* (2006.01)
*H01L 27/092* (2006.01)
*H01L 21/8258* (2006.01)

(56) References Cited

U.S. PATENT DOCUMENTS

| | | |
|---|---|---|
| 7,029,980 B2 | 4/2006 | Liu et al. |
| 7,176,481 B2 | 2/2007 | Chen et al. |
| 7,282,402 B2 * | 10/2007 | Sadaka .................. H01L 21/84 |
| | | 257/E21.63 |
| 7,598,142 B2 | 10/2009 | Ranade et al. |
| 8,017,469 B2 | 9/2011 | Luo et al. |
| 9,123,566 B2 | 9/2015 | Mitard et al. |
| 2014/0217467 A1 | 8/2014 | Pawlak et al. |
| 2014/0361378 A1 | 12/2014 | Lee et al. |

FOREIGN PATENT DOCUMENTS

| | | |
|---|---|---|
| JP | 5582582 B2 | 7/2014 |
| KR | 10-0295733 | 5/2001 |
| KR | 10-2014-0143869 A | 12/2014 |

* cited by examiner

METHODS OF FABRICATING SEMICONDUCTOR DEVICES INCLUDING COMPLEMENTARY METAL OXIDE SEMICONDUCTOR TRANSISTORS

CROSS-REFERENCE TO RELATED APPLICATION

This U.S. non-provisional patent application claims priority under 35 U.S.C. § 119 to Korean Patent Application No. 10-2015-0135860, filed on Sep. 24, 2015, in the Korean Intellectual Property Office, the disclosure of which is hereby incorporated herein by reference as if set forth in its entirety.

FIELD

The inventive concept relates generally to semiconductor devices and, more particularly, to methods of fabricating semiconductor devices.

BACKGROUND

Semiconductor devices are widely used in an electronic industry because of their small sizes, multi-functional characteristics, and/or low fabrication costs. Semiconductor devices may include semiconductor memory devices storing logical data, semiconductor logic devices processing logical data, and hybrid semiconductor devices performing various functions.

The demand for highly integrated semiconductor devices has increased with the development of the electronic industry. Thus, problems resulting from high integration may occur. For example, the process margin of a photolithography process defining fine patterns may be reduced. Furthermore, high-speed semiconductor devices have also been demanded with the development of the electronic industry.

SUMMARY

Some embodiments of the present inventive concept provide methods of fabricating semiconductor devices including forming a strain-relaxed buffer layer including a first semiconductor material on a substrate including a first region and a second region; forming a first material layer on the strain-relaxed buffer layer by an epitaxial growth process using a second semiconductor material and first dopants of a first conductivity type; forming a second material layer on the first material layer by an epitaxial growth process using a third semiconductor material; forming a recess region exposing the strain-relaxed buffer layer by etching the second and first material layers of the second region; forming a third material layer on the strain-relaxed buffer layer exposed by the recess region by an epitaxial growth process using a fourth semiconductor material and second dopants of a second conductivity type; and forming a fourth material layer on the third material layer by an epitaxial growth process using a fifth semiconductor material.

In further embodiments, each of the first to fifth semiconductor materials may include at least one of silicon (Si), germanium (Ge), silicon-germanium (SiGe), gallium-arsenide (GaAs), or gallium-nitride (GaN).

In still further embodiments, the first dopant of the first conductivity type may be one of an N-type dopant and a P-type dopant, and the second dopant of the second conductivity type may be a remaining one of the N-type dopant and the P-type dopant.

In some embodiments, the first and second material layers may be formed in-situ.

In further embodiments, the third and fourth material layers may be formed in-situ.

In still further embodiments, the method may further include forming a punch-through protection layer between the first and second material layers by an epitaxial growth process using a sixth semiconductor material and the first dopants of the first conductivity type.

In some embodiments, a concentration of the first dopants in the punch-through protection layer may be higher than a concentration of the first dopants in the first material layer.

In further embodiments, the first material layer, the punch-through protection layer, and the second material layer may be formed in-situ.

In still further embodiments, the method may further include forming a punch-through protection layer between the third and fourth material layers by an epitaxial growth process using a sixth semiconductor material and the second dopants of the second conductivity type.

In some embodiments, a concentration of the second dopants in the punch-through protection layer may be higher than a concentration of the second dopants in the third material layer.

In further embodiments, the third material layer, the punch-through protection layer, and the fourth material layer may be formed in-situ.

In still further embodiments, the forming of the recess region may include forming a mask pattern on the second material layer, and etching the second and first material layers of the second region using the mask pattern as an etch mask.

In some embodiments, the method may further include forming a spacer on an inner sidewall of the recess region.

In further embodiments, forming of the recess region may include forming a mask pattern on the second material layer; etching the second material layer of the second region using the mask pattern as an etch mask to form a preliminary recess region; forming a spacer on an inner sidewall of the preliminary recess region; and etching the first material layer of the second region using the mask pattern and the spacer as etch masks to form the recess region enlarged more than the preliminary recess region. A sidewall of the first material layer and a portion of a top surface of the stain-relaxed buffer layer may be exposed by the recess region.

In still further embodiments, the forming of the third and fourth material layers may include forming the third material layer on the strain-relaxed buffer layer and the first material layer exposed by the recess region; etching a lower portion of the spacer to expose a sidewall of the second material layer; forming a punch-through protection layer on the exposed sidewall of the second material layer and an exposed top surface of the third material layer; and forming the fourth material layer on the punch-through protection layer.

Some embodiments of the present inventive concept provide methods of fabricating semiconductor devices including epitaxially growing a first material layer on a strain-relaxed buffer layer including a first semiconductor material using a second semiconductor material and first dopants of a first conductivity type; epitaxially growing a second material layer on the first material layer using a third semiconductor material, the first and second material layers defining a recess region therein that exposes the strain-relaxed buffer layer; epitaxially growing a third material layer on the strain-relaxed buffer layer exposed by the recess region using a fourth semiconductor material and second dopants of a second conductivity type; and epitaxially growing a fourth material layer on the third material layer using a fifth semiconductor material.

In further embodiments, epitaxially growing the first, second, third and fourth material layers may not include an ion implantation process. Epitaxially growing the first, second, third and fourth material layers may not include forming a mask patter to perform the ion implantation process.

In still further embodiments, the method may further including etching the second and first material layers of the second region to provide the recess region exposing the strain-relaxed buffer layer.

In some embodiments, forming of the recess region may further include forming a mask pattern on the second material layer; etching the second material layer of the second region using the mask pattern as an etch mask to form a preliminary recess region; forming a spacer on an inner sidewall of the preliminary recess region; and etching the first material layer of the second region using the mask pattern and the spacer as etch masks to form the recess region enlarged more than the preliminary recess region. A sidewall of the first material layer and a portion of a top surface of the stain-relaxed buffer layer may be exposed by the recess region.

BRIEF DESCRIPTION OF THE DRAWINGS

The inventive concept in accordance with some embodiments will become more apparent in view of the attached drawings and accompanying detailed description.

DETAILED DESCRIPTION OF THE EMBODIMENTS

The inventive concept will now be discussed more fully hereinafter with reference to the accompanying drawings, in which exemplary embodiments of the inventive concept are shown. The inventive concept and methods of achieving them will be apparent from the following exemplary embodiments that will be discussed in more detail with reference to the accompanying drawings. The embodiments of the inventive concept may, however, be embodied in different forms and should not be constructed as limited to the embodiments set forth herein. Rather, these embodiments are provided so that this disclosure will be thorough and complete, and will fully convey the scope of the inventive concept to those skilled in the art.

The terminology used herein is for the purpose of describing particular embodiments only and is not intended to limit the invention. As used herein, the singular terms "a," "an" and "the" are intended to include the plural forms as well, unless the context clearly indicates otherwise. As used herein, the term "and/or" includes any and all combinations of one or more of the associated listed items. It will be understood that when an element is referred to as being "connected" or "coupled" to another element, it may be directly connected or coupled to the other element or intervening elements may be present.

Similarly, it will be understood that when an element such as a layer, region or substrate is referred to as being "on" another element, it can be directly on the other element or intervening elements may be present. In contrast, the term "directly" means that there are no intervening elements. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof. Additionally, exemplary embodiments are discussed herein with reference to cross-sections and/or plan views that are idealized exemplary views. Accordingly, shapes of exemplary views may be modified according to manufacturing techniques and/or allowable errors. Therefore, the embodiments of the inventive concept are not limited to the specific shape illustrated in the exemplary views, but may include other shapes that may be created according to manufacturing processes.

Exemplary embodiments of aspects of the present inventive concept explained and illustrated herein include their complementary counterparts. The same reference numerals or the same reference designators denote the same elements throughout the specification.

Hereinafter, embodiments of the inventive concept will be discussed with reference to the accompanying drawings.

FIGS. 1 through 8 are cross-sections illustrating processing steps in the fabrication of semiconductor devices according to some embodiments of the inventive concept.

Figure 1:
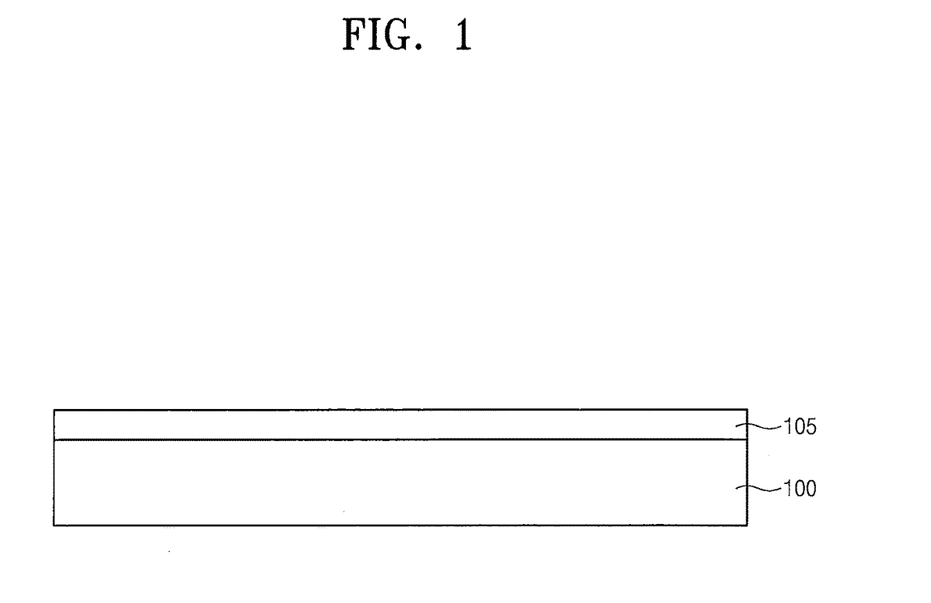
FIGS. 1 through 8 are cross-sections illustrating processing steps in the fabrication of semiconductor devices according to some embodiments of the inventive concept.

Referring first to FIG. 1, a strain-relaxed buffer layer 105 may be formed on a substrate 100. The substrate 100 may be a semiconductor substrate including, for example, silicon (Si) or germanium (Ge).

The strain-relaxed buffer layer 105 may be formed after one surface of the substrate 100 is planarized. The strain-relaxed buffer layer 105 may include, for example, a Group IV element, for example, silicon (Si), germanium (Ge), or silicon-germanium (SiGe), or may include a Group III-V compound, for example, gallium arsenide (GaAs) or gallium nitride (GaN). In particular, the Group IV material may be Si or Ge and the Group III-V material may be a compound including at least one element of In, Ga, and Al as the Group III element and at least one element of As, P, and Sb as the Group V element. In some embodiments, the strain-relaxed buffer layer 105 may be omitted without departing from the scope of the present inventive concept.

Figure 2:
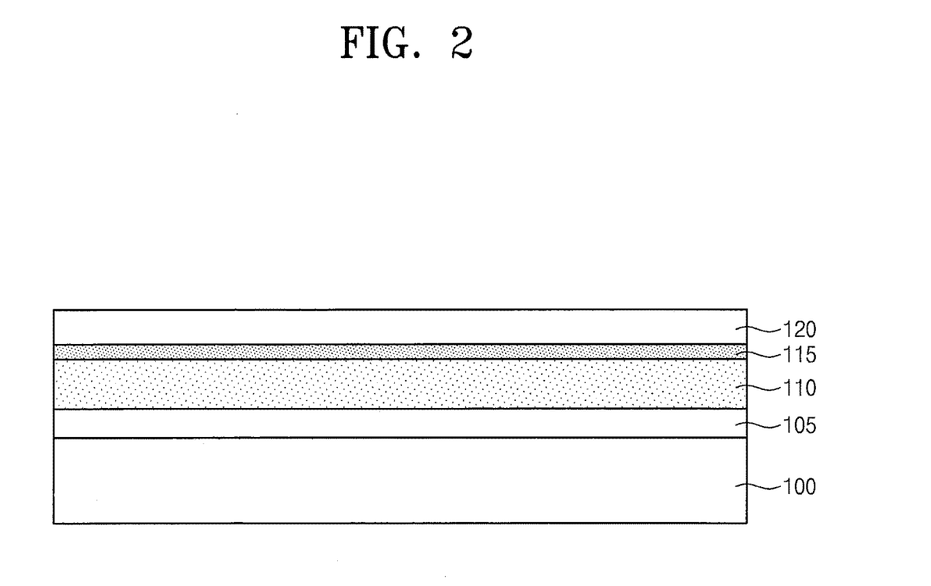

Referring now to FIG. 2, a first material layer 110 and a second material layer 120 may be sequentially formed in-situ on the strain-relaxed buffer layer 105 using, for example, an epitaxial growth process. The term 'in-situ' may mean that a process is continuously performed in the same process chamber. In other words, the first and second material layers 110 and 120 may be formed in the same chamber.

Figure 8:
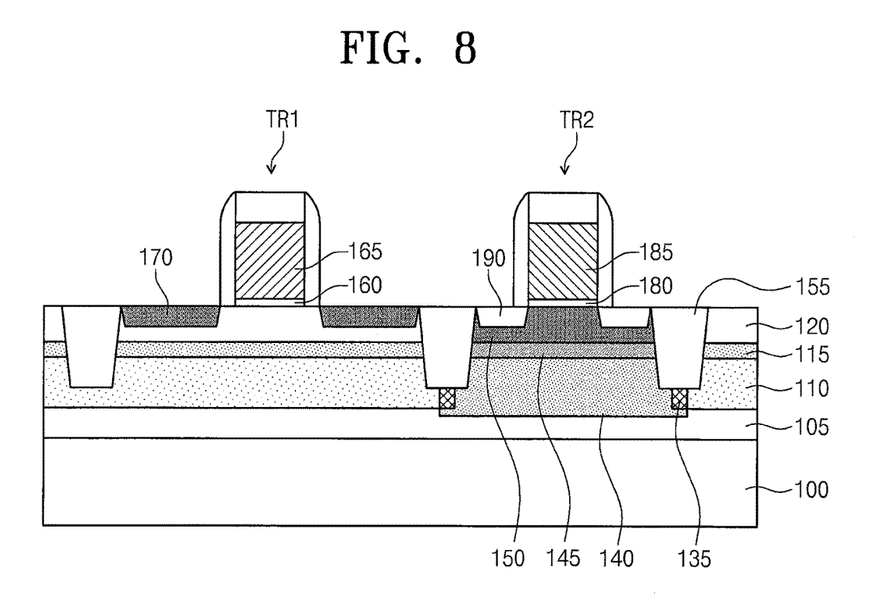

The first material layer 110 may function as a well region of a first transistor TR1 of FIG. 8 to be completed, and the second material layer 120 may function as a channel region of the first transistor TR1.

In some embodiments, when the first transistor TR1 is an NMOS transistor, an epitaxial growth process using silicon, germanium and P-type dopants may be performed on the strain-relaxed buffer layer 105 to form the first material layer 110 including silicon-germanium doped with the P-type dopants. The P-type dopants may be Group III element such as boron (B) or gallium (Ga). Subsequently, an epitaxial growth process using silicon may be performed on the first material layer 110 in the same process chamber to form the second material layer 120 including tensile silicon. A first punch-through protection layer 115 may be optionally formed between the first and second material layers 110 and 120. In particular, after the formation of the first material layer 110, an epitaxial growth process using silicon, germanium and P-type dopants may be performed to form the first punch-through protection layer 115 including silicon-germanium doped with the P-type dopants. In these embodiments, a P-type dopant concentration of the first punch-through protection layer 115 may be higher than a P-type dopant concentration of the first material layer 110.

In some embodiments, when the first transistor TR1 is a PMOS transistor, an epitaxial growth process using silicon, germanium and N-type dopants may be performed on the strain-relaxed buffer layer 105 to form the first material layer 110 including silicon-germanium doped with the N-type dopants. The N-type dopants may be a Group V element such as phosphorus (P) or arsenic (As). Subsequently, an epitaxial growth process using silicon and germanium may be performed on the first material layer 110 in the same process chamber to form the second material layer 120 including silicon-germanium. At this time, a germanium concentration of the silicon-germanium in the second material layer 120 may be higher than a germanium concentration of the silicon-germanium in the first material layer 110 such that the second material layer 120 may have a compressive force. Meanwhile, a first punch-through protection layer 115 may be optionally formed between the first and second material layers 110 and 120. In particular, after the formation of the first material layer 110, an epitaxial growth process using silicon, germanium and N-type dopants may be performed to form the first punch-through protection layer 115 including silicon-germanium doped with the N-type dopants. In these embodiments, an N-type dopant concentration of the first punch-through protection layer 115 may be higher than an N-type dopant concentration of the first material layer 110.

In some embodiments, the first punch-through protection layer 115 may be omitted with departing from the scope of the present inventive concept.

As discussed above with reference to FIG. 2, the first material layer 110, the first punch-through protection layer 115, and the second material layer 120 may be formed in-situ, and the dopants may also supplied into the process chamber during the formation of the first material layer 110, the first punch-through protection layer 115, and the second material layer 120. Thus, the first and second material layers 110 and 120 and the first punch-through protection layer 115 may be doped with the dopants without an ion implantation process. As a result, it is possible to reduce the likelihood, or possibly prevent, damage of the first and second material layer 110 and 120 and the first punch-through protection layer 115, which may be caused by an ion implantation process. Furthermore, since a mask pattern for the ion implantation process is not needed, processes of fabricating the semiconductor device may be simplified.

Figure 3:
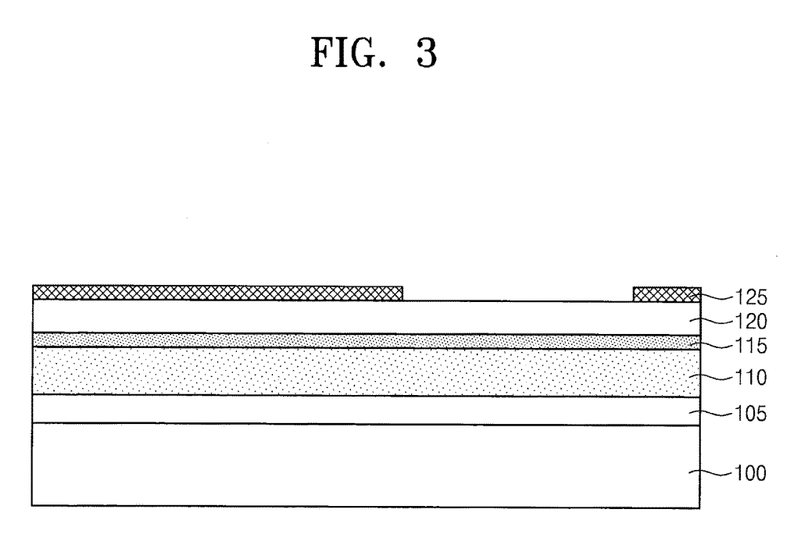

Referring to FIG. 3, a mask pattern 125 may be formed on the second material layer 120. The mask pattern 125 may include a material having an etch selectivity with respect to the first and second material layer 110 and 120, the first punch-through protection layer 115, and the strain-relaxed buffer layer 105. For example, the mask pattern 125 may include an insulating material such as silicon nitride.

A region exposed by the mask pattern 125 may be a region in which a second transistor TR2 of FIG. 8 will be formed.

Figure 4:
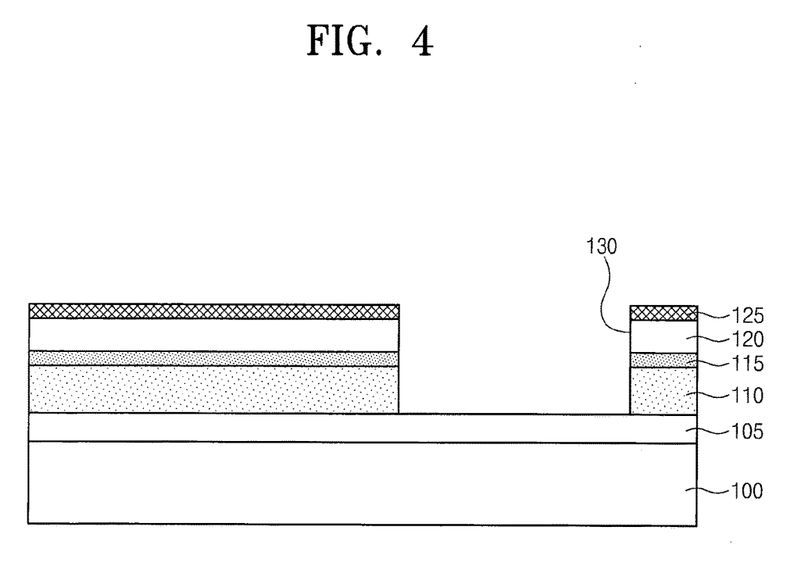

Referring to FIG. 4, the second material layer 120, the first punch-through protection layer 115, and the first material 110 may be etched using the mask pattern 125 as an etch mask to form a recess region 130.

Figure 5:
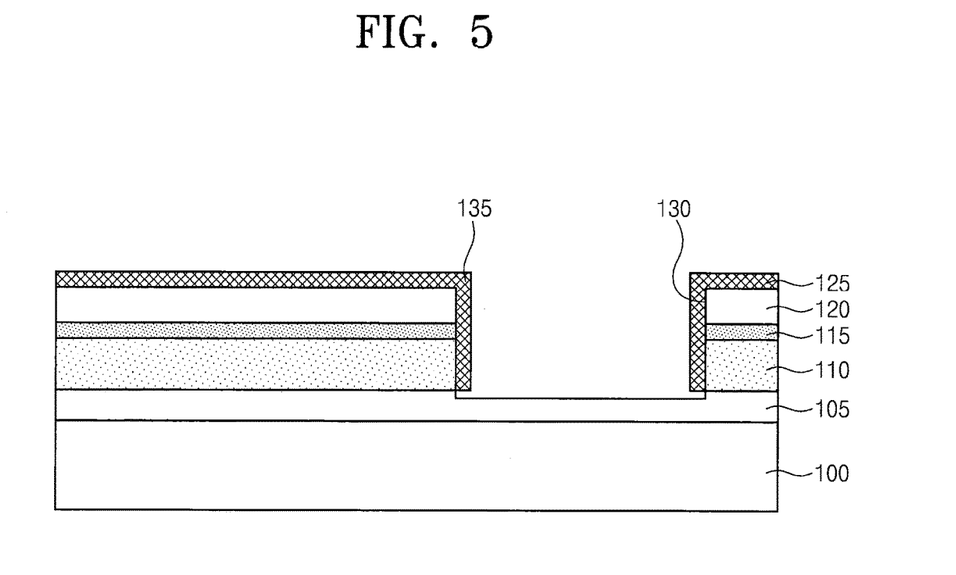

Referring to FIG. 5, a spacer 135 may be formed on a sidewall of the recess region 130. The spacer 135 may include substantially the same material as the mask pattern 125. For example, the spacer 135 may include an insulating material such as silicon nitride.

In particular, a spacer layer may be conformally formed on an inner surface of the recess region 130 and a surface of the mask pattern 125. The spacer layer may be anisotropically etched to form the spacer 135 exposing the strain-relaxed buffer layer 105 of a bottom surface of the recess region 130.

Figure 6:
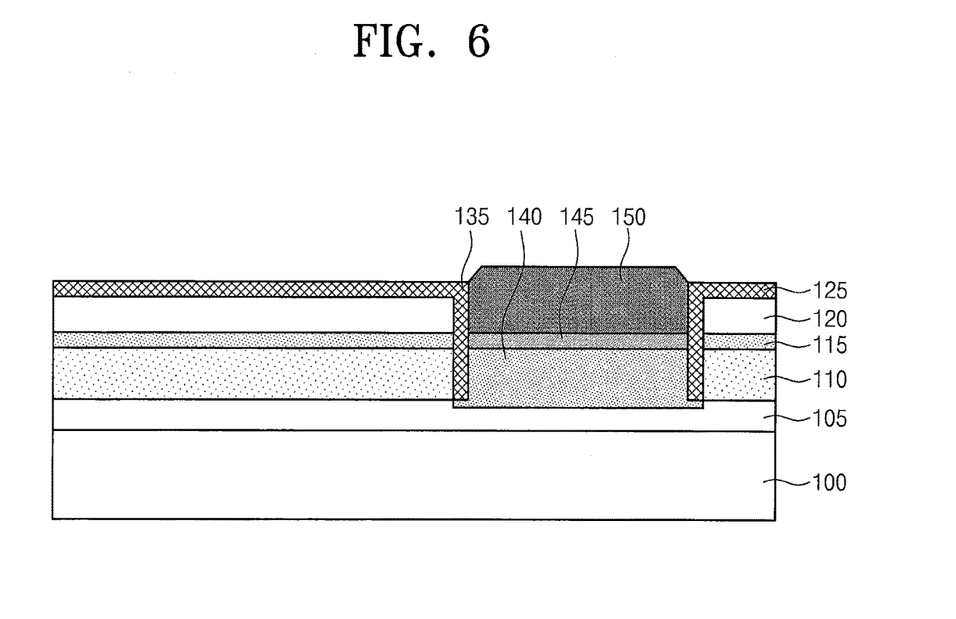

Referring now to FIG. 6, a third material layer 140 and a fourth material layer 150 may be sequentially formed in-situ on the strain-relaxed buffer layer 105 exposed at the bottom surface of the recess region 130 by an epitaxial growth process.

The third material layer 140 may function as a well region of the second transistor TR2 to be completed later, and the fourth material layer 150 may function as a channel region of the second transistor TR2.

In some embodiments, when the first transistor TR1 is an NMOS transistor and the second transistor TR2 is a PMOS transistor, an epitaxial growth process using silicon, germanium and N-type dopants may be performed on the strain-relaxed buffer layer 105 exposed through the recess region 130 to form the third material layer 140 including silicon-germanium doped with the N-type dopants. The N-type dopants may be a Group V element such as phosphorous (P) or arsenic (As). Subsequently, an epitaxial growth process using silicon and germanium may be performed on the third material layer 140 in the same process chamber to form the fourth material layer 150 including silicon-germanium having a compressive force (c-SiGe). A second punch-through protection layer 145 may be further formed between the third and fourth material layers 140 and 150. In particular, after the formation of the third material layer 140, an epitaxial growth process using silicon, germanium and N-type dopants may be performed to form the second punch-through protection layer 145 including silicon-germanium doped with the N-type dopants. In these embodiments, an N-type dopant concentration of the second punch-through protection layer 145 may be higher than an N-type dopant concentration of the third material layer 140.

In some embodiments, when the first transistor TR1 is a PMOS transistor and the second transistor TR2 is an NMOS transistor, an epitaxial growth process using silicon, germanium and P-type dopants may be performed on the strain-relaxed buffer layer 105 exposed through the recess region 130 to form the third material layer 140 including silicon-germanium doped with the P-type dopants. The P-type dopants may be a Group III element such as boron (B) or gallium (Ga). Subsequently, an epitaxial growth process using silicon may be performed on the third material layer 140 in the same process chamber to form the fourth material layer 150 including tensile silicon. A second punch-through protection layer 145 may be optionally formed between the third and fourth material layers 140 and 150. In particular, after the formation of the third material layer 130, an epitaxial growth process using silicon, germanium and P-type dopants may be performed to form the second punch-through protection layer 145 including silicon-germanium doped with the P-type dopants. In these embodiments, a P-type dopant concentration of the second punch-through protection layer 145 may be higher than a P-type dopant concentration of the third material layer 140.

In some embodiments, the second punch-through protection layer 145 may be omitted without departing from the scope of the present inventive concept.

As discussed with reference to FIG. 6, the third material layer 140, the second punch-through protection layer 145, and the fourth material layer 150 may be formed in-situ, and the dopants may also supplied into the process chamber during the formation of the third and fourth material layers 140 and 150 and the second punch-through protection layer 145. Thus, the third and fourth material layers 140 and 150 and the second punch-through protection layer 145 may be doped with the dopants without an ion implantation process. Thus, it is possible to, reduce the likelihood, or possibly prevent, damage of the third and fourth material layers 140 and 160 and the second punch-through protection layer 145, which may be caused by an ion implantation process. Furthermore, since a mask pattern for the ion implantation process is not needed, processes of fabricating the semiconductor device may be simplified.

In some embodiments, the mask pattern 125, the spacer 135, and the fourth material layer 150 may be planarized or polished until a top surface of the second material layer 120 is exposed.

Figure 7:
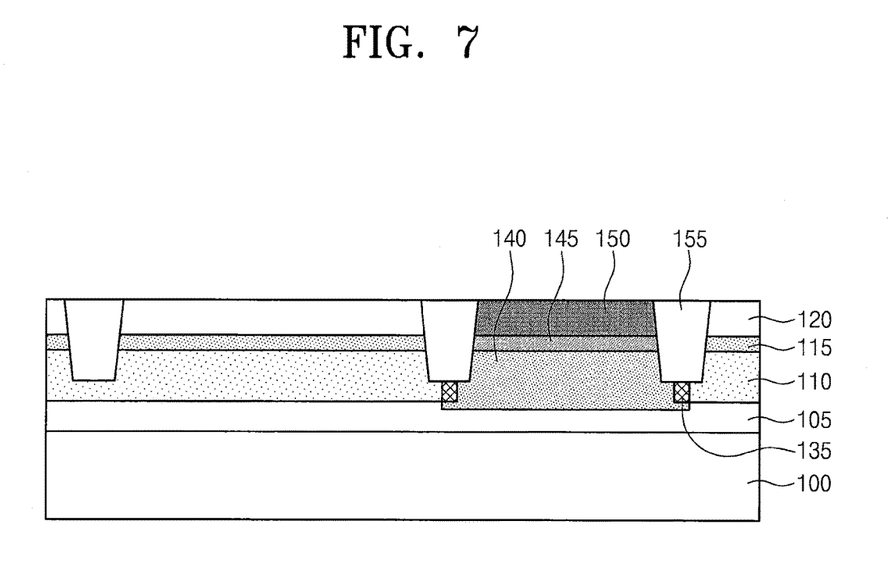

Referring to FIG. 7, a device isolation pattern 115 may be formed on the substrate 100 on which the first to fourth material layers 110, 120, 140, and 150 and the first and second punch-through protection layers 115 and 145 are formed.

In some embodiments, a trench may be formed by patterning the second material layer 120, the first punch-through protection layer 115 and the first material layer 110 and by patterning the fourth material layer 150, the second punch-through protection layer 145 and the third material layer 140. In some embodiments, a portion of the trench may be formed in a boundary region between the first and second material layers 110 and 120 and the third and fourth material layers 140 and 150. The spacer 135 may be formed between the first and second material layers 110 and 120 and the third and fourth material layers 140 and 150. Thus, at least a portion of spacer 135 may be etched during the formation of the portion of the trench. In some embodiments, a portion of the spacer 135 may remain under the trench. At this time, the trench may not expose the strain-relaxed buffer layer 105. In some embodiments, the spacer 135 may be completely removed during a cleaning process, for example, a strip process, performed after the formation of the trench.

The trench may be filled with an insulating material, for example, silicon oxide, silicon nitride, and/or silicon oxynitride, to form the device isolation pattern 155.

Referring to FIG. 8, the first transistor TR1 may be formed on the second material layer 120, and the second transistor TR2 may be formed on the fourth material layer 150.

In some embodiments, first and second gate insulating patterns 160 and 180 may be formed on the second and fourth material layers 120 and 150, respectively. Each of the first and second gate insulating patterns 160 and 180 may include an insulating material such as silicon oxide and/or may include an insulating metal oxide such as hafnium oxide, aluminum oxide, or zirconium oxide.

In some embodiments, in the case in which the first transistor TR1 is the NMOS transistor and the second transistor TR2 is the PMOS transistor, a first gate electrode 165 including poly-silicon doped with N-type dopants or a metal, for example, tantalum-titanium (Ta—Ti), may be formed on the first gate insulating pattern 160. N-type dopants may be provided into the second material layer 120 disposed at both sides of the first gate electrode 165, thereby forming first source/drain regions 170. A second gate electrode 185 including poly-silicon doped with P-type dopants or a metal, for example, molybdenum (Mo), may be formed on the second gate insulating pattern 180. P-type dopants may be provided into the fourth material layer 150 disposed at both sides of the second gate electrode 185, thereby forming second source/drain regions 190.

The fourth material layer 150 may be covered with a mask pattern during the formation of the first transistor TR1. Likewise, the second material layer 120 may be covered with a mask pattern during the formation of the second transistor TR2. Embodiments of the inventive concept are not limited to formation order of the first and second transistors TR1 and TR2. For example, the first transistor TR1 may be formed after the formation of the second transistor TR2, or the second transistor TR2 may be formed after the formation of the first transistor TR1.

In some embodiments, the first transistor TR1 may be the PMOS transistor and the second transistor TR2 may be the NMOS transistor. In these embodiments, the aforementioned processes performed for forming the first transistor TR1 of the NMOS transistor may be performed to form the second transistor TR2 of the NMOS transistor, and the aforementioned processes performed for forming the second transistor TR2 of the PMOS transistor may be performed to form the first transistor TR1 of the PMOS transistor.

In some embodiments, bottom surfaces of the first source/drain regions 170 and/or the second source/drain regions 190 may be higher than bottom surfaces of the second and fourth material layers 120 and 150. In some embodiments, the bottom surfaces of the first source/drain regions 170 and/or the second source/drain regions 190 may be disposed at substantially the same level as or a higher level than bottom surfaces of the first and second punch-through protection layers 115 and 145.

Depths of the first source/drain regions 170 and/or the second source/drain regions 190 may be varied according to a kind and/or characteristics of the semiconductor device. For example, even though not shown in the drawings, when the transistors TR1 and TR2 are fin-type transistors, the first and second punch-through protection layers 115 and 145 may also be included in channel layers having stress, and the depths of the source/drain regions may be greater or smaller than thicknesses of the channel layers on the basis of a height of the fin-type transistor.

Referring now to FIGS. 9 through 20, cross-sections illustrating processing steps in the fabrication of semiconductor devices in accordance with some embodiments of the inventive concept will be discussed.

Figure 9:
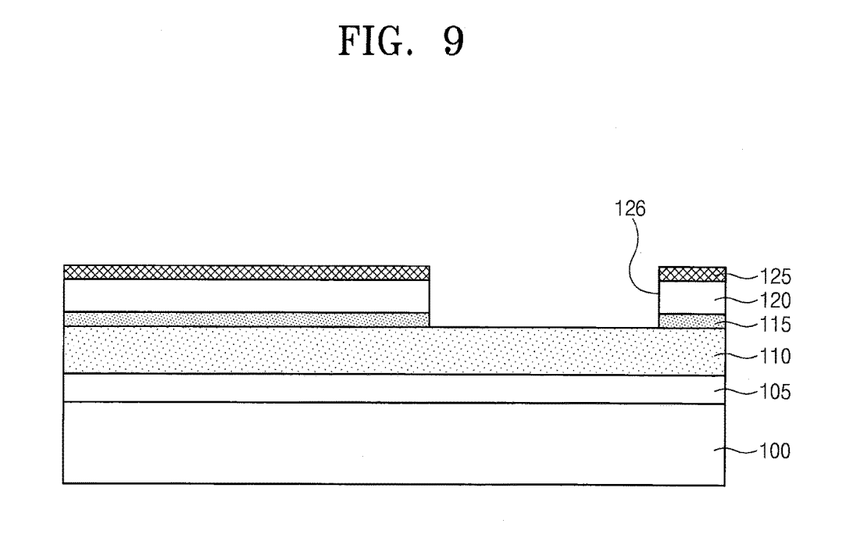
FIGS. 9 through 20 are cross-sections illustrating processing steps in the fabrication of semiconductor devices according to some embodiments of the inventive concept.

Referring first to FIG. 9, a strain-relaxed buffer layer 105, a first material layer 110, a first punch-through protection layer 115, a second material layer 120, and a mask pattern 125 may be sequentially formed on a substrate 100. Processes of forming the strain-relaxed buffer layer 105, the first material layer 110, the first punch-through protection layer 115, the second material layer 120, and the mask pattern 125 may be substantially similar to those processes discussed with reference to FIGS. 1 to 3, and thus the detailed descriptions will not be repeated herein in the interest of brevity.

Embodiments in which a first transistor (TR1 of FIG. 20) on the second material layer 120 is an NMOS transistor and a second transistor (TR2 of FIG. 20) on a fourth material layer 150 is a PMOS transistor will be discussed for the purpose of ease and convenience in explanation. Thus, the first material layer 110 and the first punch-through protection layer 115 may include P-type dopants, and the second material layer 120 may include tensile silicon (t-Si).

The second material layer 120 and the first punch-through protection layer 115 may be etched using the mask pattern 125 as an etch mask to form a first recess region 126 exposing a surface of the first material layer 110.

In some embodiments, an etch stop layer may be further formed between the first material layer 110 and the first punch-through protection layer 115. The etch stop layer may include substantially the same material as the first material layer 110, but a dopant concentration of the etch stop layer may be different from that of the first material layer 110. The etching process may be ended using the etch stop layer.

Figure 10:
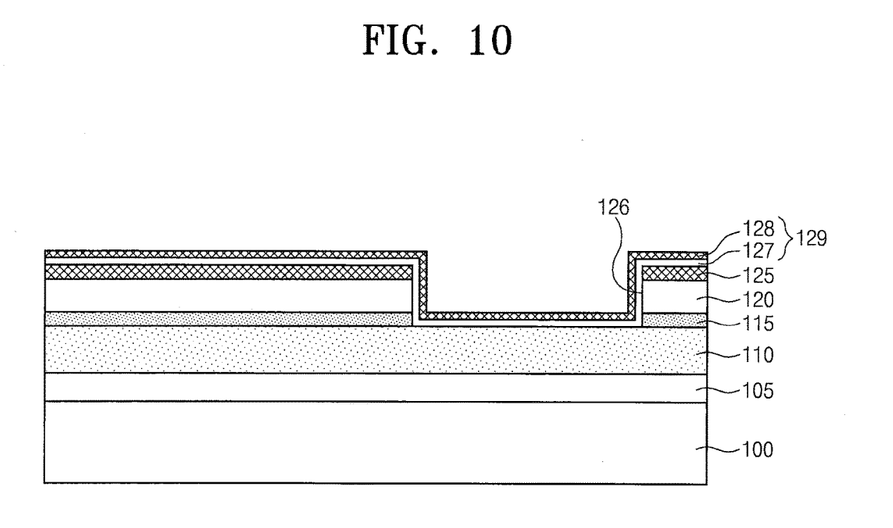

Referring now to FIG. 10, a spacer layer 129 may be conformally formed on a surface of the mask pattern 125 and an inner surface of the first recess region 126.

The spacer layer 129 may have a multi-layered structure. For example, the spacer layer 129 may include a first layer 127 including silicon oxide and a second layer 128 including silicon nitride.

Figure 11:
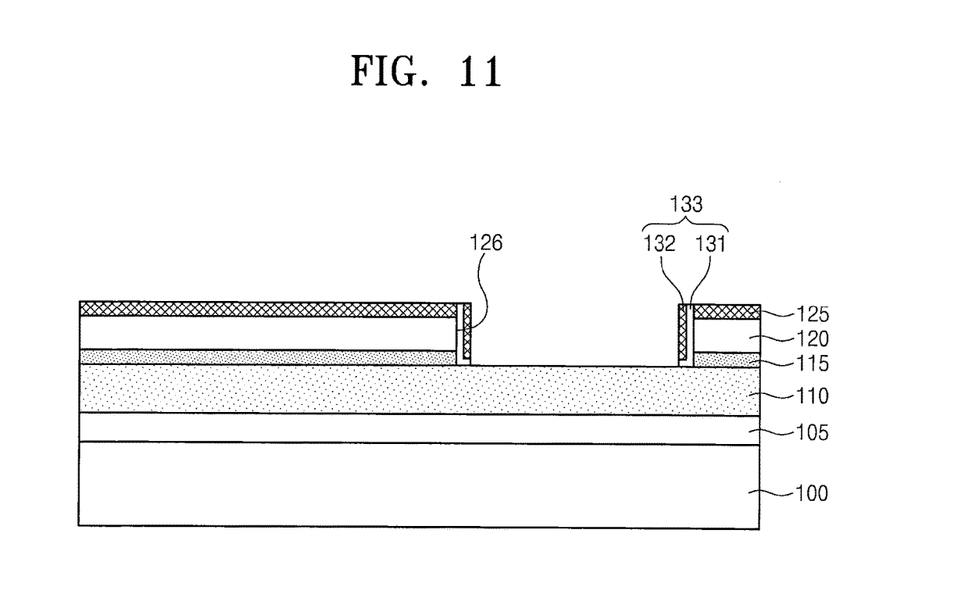

Referring now to FIG. 11, the spacer layer 129 may be anisotropically etched to form a spacer 133 on an inner sidewall of the first recess region 126. The spacer 133 may include a first pattern 131 and a second pattern 132. The first pattern 131 may have an L-shape, and both ends of the first pattern 131 may be exposed outward. The second pattern 132 may be disposed on the first pattern 131. The first material layer 110 may be exposed at a bottom surface of the first recess region 126.

Figure 12:
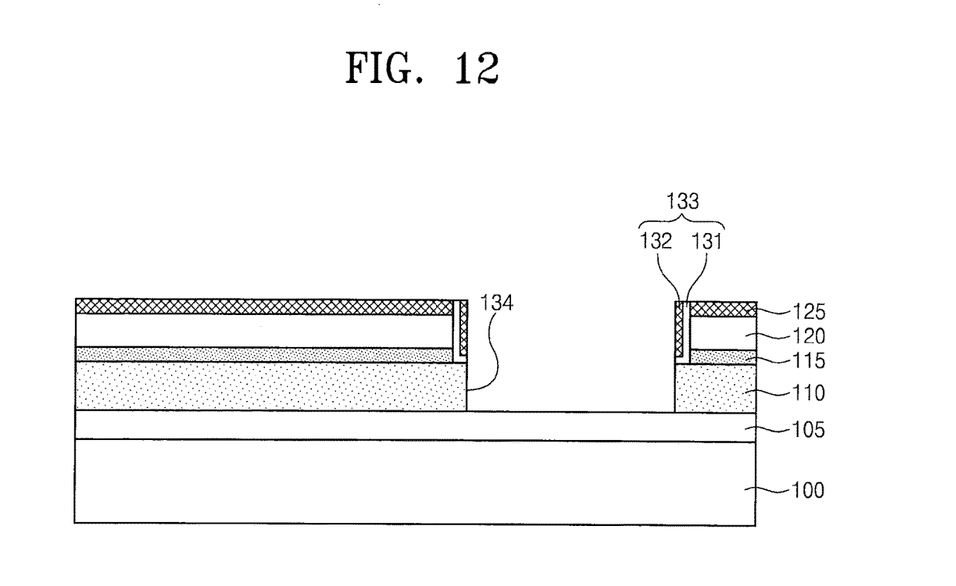

Referring to FIG. 12, the first material layer 110 exposed by the first recess region 126 may be etched to form a second recess region 134 extending downward from the bottom surface of the first recess region 126.

A sidewall of the second recess region 134 may be formed of the first material layer 110, and a bottom surface of the second recess region 134 may correspond to a portion of a top surface of the strain-relaxed buffer layer 105.

Figure 13:
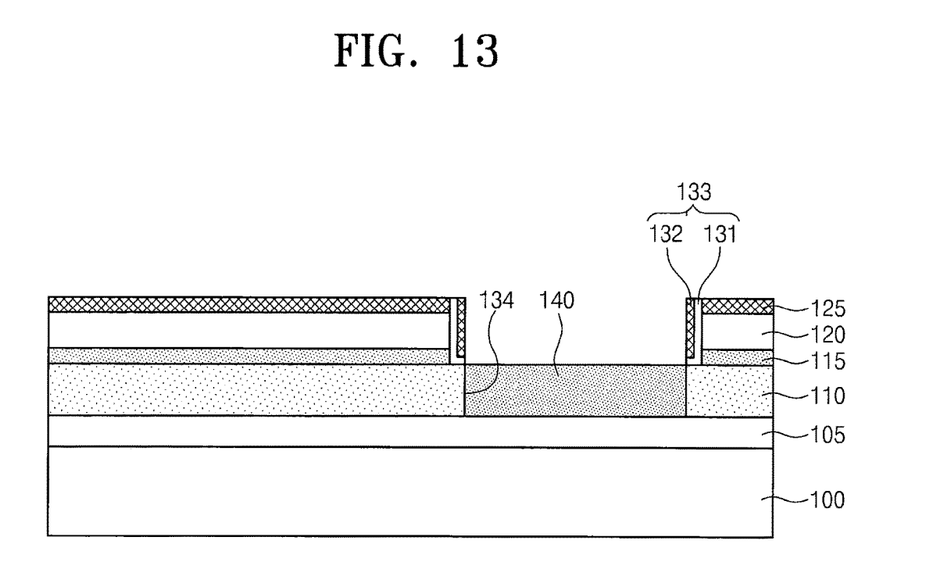

Referring to FIG. 13, an epitaxial growth process using or supplying silicon, germanium and N-type dopants may be performed on the first material layer 110 and the strain-relaxed buffer layer 105 which are exposed by the second recess region 134, thereby forming a third material layer 140. In some embodiments, the third material layer 140 may be grown from the first material layer 110 exposed by the sidewall of the second recess region 134 and may also be grown from the top surface of the strain-relaxed buffer layer 105 exposed by the bottom surface of the second recess region 134. At this time, a lattice constant of the first material layer 110 may be different from that of the strain-relaxed buffer layer 105, and thus a growth rate of the third material layer 140 grown from the bottom surface of the second recess region 134 may be different from a growth rate of the third material layer 140 grown from the sidewall of the second recess region 134.

Figure 14:
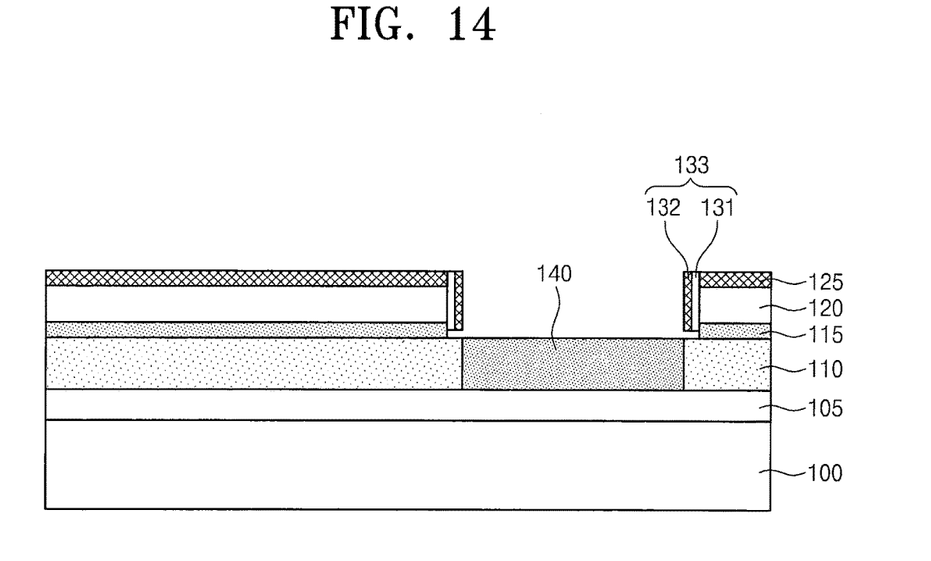

Referring now to FIG. 14, the exposed first pattern 131 of the spacer 133 may be etched to expose a sidewall of the first punch-through protection layer 115.

Figure 15:
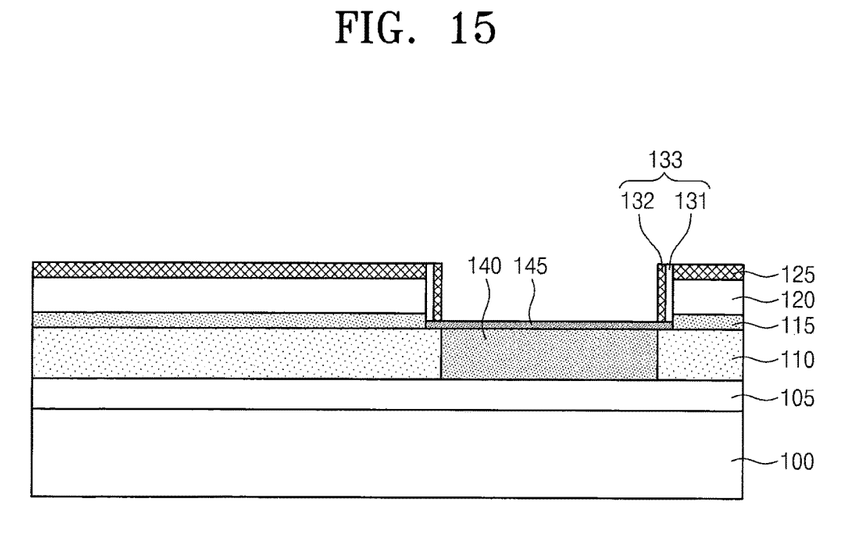

Referring now to FIG. 15, an epitaxial growth process using or supplying silicon, germanium and N-type dopants may be performed on the first punch-through protection layer 115 exposed by the spacer 133 and the third material layer 140 formed in the second recess region 134, thereby forming a second punch-through protection layer 145. In some embodiments, the second punch-through protection layer 145 may be grown from the exposed sidewall of the first punch-through protection layer 115 and may also be grown from the exposed top surface of the third material layer 140. A lattice constant of the first punch-through protection layer 115 may be different from that of the third material layer 140, and thus a growth rate of the second punch-through protection layer 145 grown from the exposed sidewall of the first punch-through protection layer 115 may be different from a growth rate of the second punch-through protection layer 145 grown from the exposed top surface of the third material layer 140.

Figure 16:
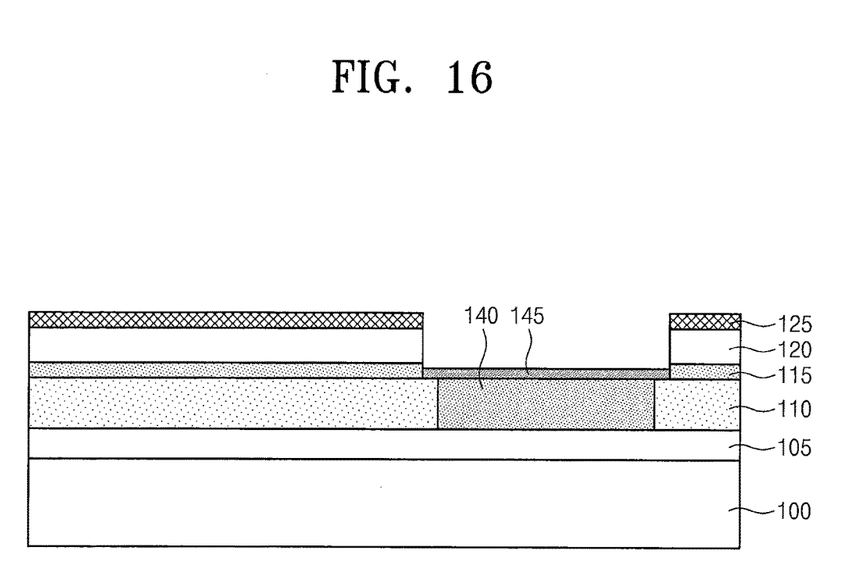

As illustrated in FIG. 16, the spacer 133 may be removed to expose a sidewall of the second material layer 120. In certain embodiments, unlike the embodiment discussed with reference to FIGS. 14 to 16, the second punch-through protection layer 145 may be formed after the spacer 133 is completely removed.

Figure 17:
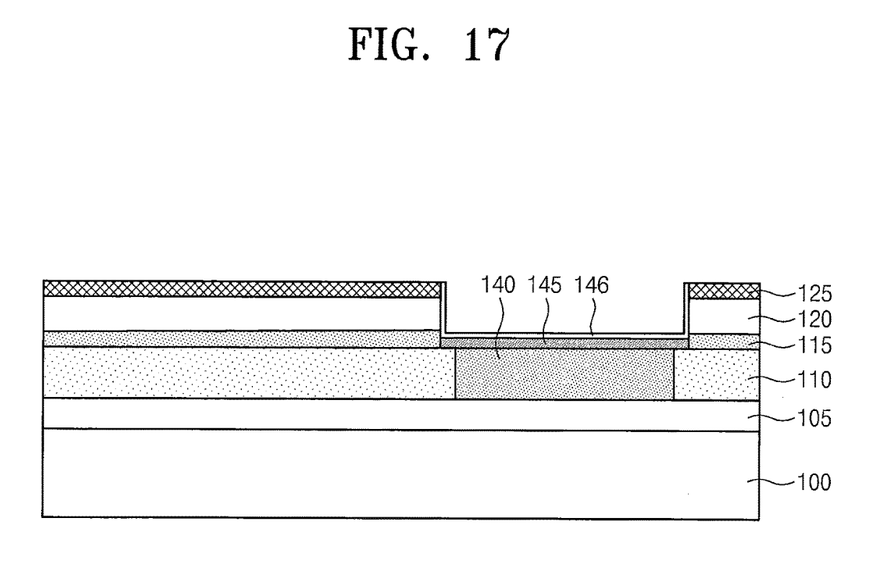

Referring to FIG. 17, the growth rates in the third material layer 140 may be different from each other and the growth rates in the second punch-through protection layer 145 may be different from each other by the epitaxial growth processes as discussed with reference to FIGS. 13 to 15, and thus a height difference may occur between the first and third material layers 110 and 140 and/or a height difference may occur between the first and second punch-through protection layers 115 and 145.

An additional layer 146 may be formed to compensate the height difference. The additional layer 146 may be formed along a top surface of the second punch-through protection layer 145 and the sidewall of the second material layer 120.

In some embodiments, the additional layer 146 may include substantially the same material as the strain-relaxed buffer layer 105. In certain embodiments, the additional layer 146 may be omitted.

Figure 18:
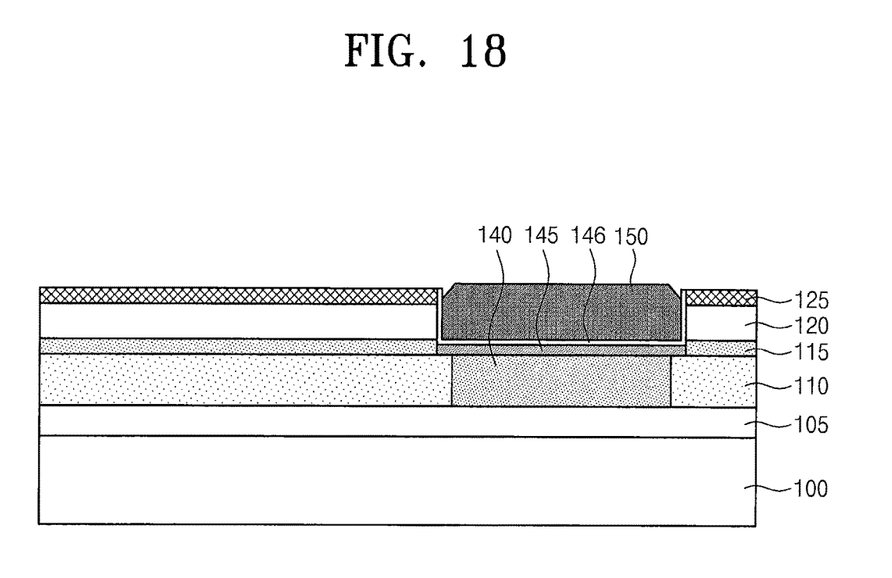

Referring to FIG. 18, an epitaxial growth process using or supplying silicon and germanium may be performed on the additional layer 146 to form a fourth material layer 150 including silicon-germanium having a compressive force.

Figure 19:
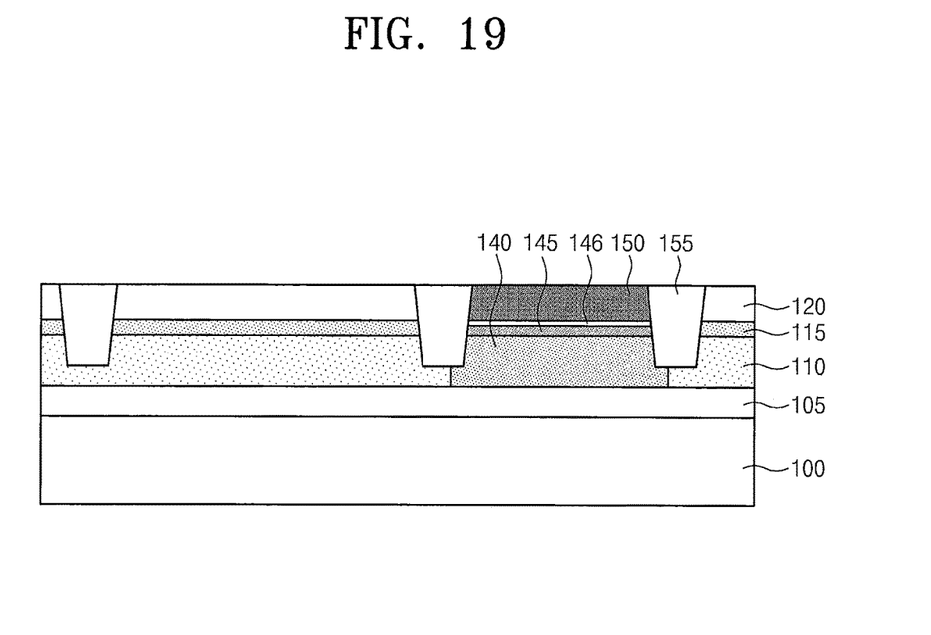

Referring to FIG. 19, a device isolation pattern 155 may be formed on the substrate 100 having the first to fourth material layers 110, 120, 140, and 150. In some embodiments, the second and fourth 120 and 150, the first and second punch-through protection layers 115 and 145, and the first and third material layers 110 and 140 may be patterned to form a trench. A portion of the trench may be formed at an interface portion between the second and fourth material layers 120 and 150, an interface portion between the first and second punch-through protection layers 115 and 145, and an interface portion between the first and third material layers 110 and 140. The trench may be filled with an insulating material, for example, silicon oxide, silicon nitride, and/or silicon oxynitride, to form the device isolation pattern 155.

Figure 20:
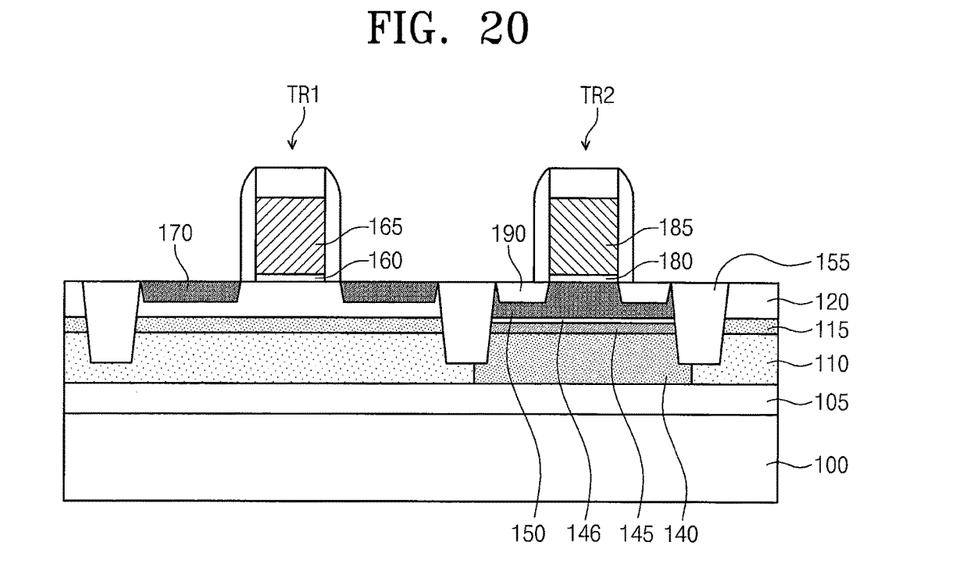

Referring to FIG. 20, a first transistor TR1 may be formed on the second material layer 120, and a second transistor TR2 may be formed on the fourth material layer 150. The first and second transistors TR1 and TR2 may be similar to those discussed with reference to FIG. 8, and thus the detailed descriptions are not repeated herein in the interest of brevity.

In some embodiments, bottom surfaces of the first source/drain regions 170 and/or the second source/drain regions 190 may be higher than bottom surfaces of the second and fourth material layers 120 and 150. In some embodiments, the bottom surfaces of the first source/drain regions 170 and/or the second source/drain regions 190 may be disposed at substantially the same level as or a higher level than bottom surfaces of the first and second punch-through protection layers 115 and 145.

Depths of the first source/drain regions 170 and/or the second source/drain regions 190 may be varied according to a kind and/or characteristics of the semiconductor device. For example, when the transistors TR1 and TR2 are fin-type transistors, the first and second punch-through protection layers 115 and 145 may also be included in channel layers having stress, and the depths of the source/drain regions may be greater or smaller than thicknesses of the channel layers on the basis of a height of the fin-type transistor.

According to some embodiments of the inventive concept, the first and second material layers may be formed using the epitaxial growth processes, and the third and fourth material layers may be formed using the epitaxial growth processes. At this time, the dopants may also be supplied during at least some of the epitaxial growth processes. Thus, an ion implantation process may be omitted, and thus it may be possible to reduce the likelihood, or possibly prevent, the damage of the material layers which may be caused by the ion implantation process. Furthermore, a mask pattern for the ion implantation process may not be needed to reduce a process time and a process cost of the semiconductor device.

While the inventive concept has been discussed with reference to example embodiments, it will be apparent to those skilled in the art that various changes and modifications may be made without departing from the spirits and scopes of the inventive concept. Therefore, it should be understood that the above embodiments are not limiting, but illustrative. Thus, the scope of the inventive concept is to be determined by the broadest permissible interpretation of the following claims and their equivalents, and shall not be restricted or limited by the foregoing description.

What is claimed is:

1. A method of fabricating a semiconductor device, the method comprising:
    forming a strain-relaxed buffer layer including a first semiconductor material on a substrate, the substrate including a first region and a second region;
    epitaxially growing a first material layer on the strain-relaxed buffer layer using a second semiconductor material and first dopants of a first conductivity type;
    epitaxially growing a second material layer on the first material layer using a third semiconductor material;
    etching the second and first material layers of the second region to provide a recess region exposing the strain-relaxed buffer layer;
    epitaxially growing a third material layer on the strain-relaxed buffer layer exposed by the recess region using a fourth semiconductor material and second dopants of a second conductivity type; and
    epitaxially growing a fourth material layer on the third material layer using a fifth semiconductor material.

2. The method of claim 1, wherein each of the first to fifth semiconductor materials includes at least one of silicon (Si), germanium (Ge), silicon-germanium (SiGe), gallium-arsenide (GaAs), and gallium-nitride (GaN).

3. The method of claim 1:
    wherein the first dopant of the first conductivity type is one of an N-type dopant and a P-type dopant; and
    wherein the second dopant of the second conductivity type is a remaining one of the N-type dopant and the P-type dopant.

4. The method of claim 1, wherein the first and second material layers are formed in-situ.

5. The method of claim 1, wherein the third and fourth material layers are formed in-situ.

6. The method of claim 1, further comprising:
    forming a punch-through protection layer between the first and second material layers by an epitaxial growth process using a sixth semiconductor material and the first dopants of the first conductivity type.

7. The method of claim 6, wherein a concentration of the first dopants in the punch-through protection layer is higher than a concentration of the first dopants in the first material layer.

8. The method of claim 6, wherein the first material layer, the punch-through protection layer, and the second material layer are formed in-situ.

9. The method of claim 1, further comprising forming a punch-through protection layer between the third and fourth material layers by an epitaxial growth process using a sixth semiconductor material and the second dopants of the second conductivity type.

10. The method of claim 9, wherein a concentration of the second dopants in the punch-through protection layer is higher than a concentration of the second dopants in the third material layer.

11. The method of claim 9, wherein the third material layer, the punch-through protection layer, and the fourth material layer are formed in-situ.

12. The method of claim 1, wherein forming of the recess region comprises:
    forming a mask pattern on the second material layer; and
    etching the second and first material layers of the second region using the mask pattern as an etch mask.

13. The method of claim 12, further comprising forming a spacer on an inner sidewall of the recess region.

14. The method of claim 1, wherein forming of the recess region comprises:
    forming a mask pattern on the second material layer;
    etching the second material layer of the second region using the mask pattern as an etch mask to form a preliminary recess region;
    forming a spacer on an inner sidewall of the preliminary recess region; and
    etching the first material layer of the second region using the mask pattern and the spacer as etch masks to form the recess region enlarged more than the preliminary recess region,
    wherein a sidewall of the first material layer and a portion of a top surface of the strain-relaxed buffer layer are exposed by the recess region.

15. The method of claim 14, wherein the forming of the third and fourth material layers comprises:
    forming the third material layer on the strain-relaxed buffer layer and the first material layer exposed by the recess region;
    etching a lower portion of the spacer to expose a sidewall of the second material layer;
    forming a punch-through protection layer on the exposed sidewall of the second material layer and an exposed top surface of the third material layer; and
    forming the fourth material layer on the punch-through protection layer.

16. A method of fabricating a semiconductor device, the method comprising:
    epitaxially growing a first material layer on a strain-relaxed buffer layer including a first semiconductor material; the first material layer is grown using a second semiconductor material and first dopants of a first conductivity type;
    epitaxially growing a second material layer on the first material layer using a third semiconductor material, the first and second material layers defining a recess region therein that exposes the strain-relaxed buffer layer;

epitaxially growing a third material layer on the strain-relaxed buffer layer exposed by the recess region using a fourth semiconductor material and second dopants of a second conductivity type; and epitaxially growing a fourth material layer on the third material layer using a fifth semiconductor material.

17. The method of claim 16, wherein epitaxially growing the first, second, third and fourth material layers do not include an ion implantation process.

18. The method of claim 17, wherein epitaxially growing the first, second, third and fourth material layers does not include forming a mask pattern to perform the ion implantation process.

19. The method of claim 16, further comprising etching the second and first material layers to provide the recess region exposing the strain-relaxed buffer layer.

20. The method of claim 19, wherein forming of the recess region further comprises:

forming a mask pattern on the second material layer;

etching the second material layer using the mask pattern as an etch mask to form a preliminary recess region;

forming a spacer on an inner sidewall of the preliminary recess region; and etching the first material layer using the mask pattern and the spacer as etch masks to form the recess region enlarged more than the preliminary recess region, wherein a sidewall of the first material layer and a portion of a top surface of the strain-relaxed buffer layer are exposed by the recess region.

\* \* \* \* \*